(12) United States Patent
Zhang

(10) Patent No.: US 8,043,931 B1
(45) Date of Patent: Oct. 25, 2011

(54) METHODS FOR FORMING MULTI-LAYER SILICON STRUCTURES

(76) Inventor: Gang Zhang, Monterey Park, CA (US)

( * ) Notice: Subject to any disclaimer, the term of this patent is extended or adjusted under 35 U.S.C. 154(b) by 990 days.

(21) Appl. No.: 11/855,906

(22) Filed: Sep. 14, 2007

Related U.S. Application Data

(60) Provisional application No. 60/826,033, filed on Sep. 18, 2006.

(51) Int. Cl.
*H01L 21/00* (2006.01)
*H01L 21/331* (2006.01)
*H01L 21/76* (2006.01)

(52) U.S. Cl. ............ 438/421; 438/109; 438/319
(58) Field of Classification Search ............ 438/109, 438/319, 421
See application file for complete search history.

(56) References Cited

U.S. PATENT DOCUMENTS

| | | | |
|---|---|---|---|
| 5,955,818 A | 9/1999 | Bertin et al. | |
| 6,332,568 B1 | 12/2001 | Christenson | |
| 6,392,787 B1 * | 5/2002 | Cirelli et al. ............ | 359/321 |
| 6,786,968 B2 * | 9/2004 | Theil ............ | 117/93 |
| 7,332,410 B2 | 2/2008 | Tong | |
| 7,345,370 B2 * | 3/2008 | Furukawa et al. ............ | 257/784 |
| 2003/0015781 A1 * | 1/2003 | Farrar ............ | 257/686 |
| 2006/0076664 A1 * | 4/2006 | Chen et al. ............ | 257/686 |
| 2006/0252229 A1 * | 11/2006 | Joly et al. ............ | 438/455 |
| 2006/0252278 A1 * | 11/2006 | Mak et al. ............ | 438/784 |
| 2007/0161155 A1 * | 7/2007 | Yang ............ | 438/110 |

OTHER PUBLICATIONS

Fréchette, "High-Speed Microfabricated Silicon Turbomachinery and Fluid Film Bearings", Journal of Microelectromechanical Systems, vol. 14, No. 1, pp. 141-152 (2005).
Dragoi, "Advanced Techniques for 3D Devices in Wafer-Bonding Processes", Solid State Technology, vol. 47, No. 6, pp. 55-58 (2004).
Maluf, "Polysilicon Surface Micromachining" in "An Introduction to Microelectromechanical Systems Engineering", Artech House, Inc., Norwood, MA, pp. 69-71(2004).
Christenson, "A Batch Wafer Scale LIGA Assembly and Packaging Technique via Diffusion Bonding," Proceedings of 12th IEEE Micro Electro Mechanical Systems Workshop 1999, Orlando, Florida, pp. 476-481 (1999).

* cited by examiner

*Primary Examiner* — James M Mitchell

(57) ABSTRACT

The embodiments of the present invention are directed to the formation of multi-layer silicon structures by forming and attaching a plurality of individual layers or structures where each of the layers or the structures comprises at least silicon forming a desired pattern. In some embodiments or some applications of some embodiments, at least one of the plurality of individual layers or the structures comprises a plurality of discrete silicon features that are combined together with at least one sacrificial material. In some embodiments or some applications of some embodiments, at least one of the plurality of individual layers or the structures comprises a plurality of discrete silicon features that are supported by a temporary substrate. Still in some embodiments or some applications of some embodiments, at least one of the plurality of individual layers or the structures needs to be machined after it is attached to a receiver such as a substrate or an another layer or structure. The present invention also discloses various fabrication methods for making required silicon layers or structures and attaching methods for forming multi-layer silicon structures.

14 Claims, 16 Drawing Sheets

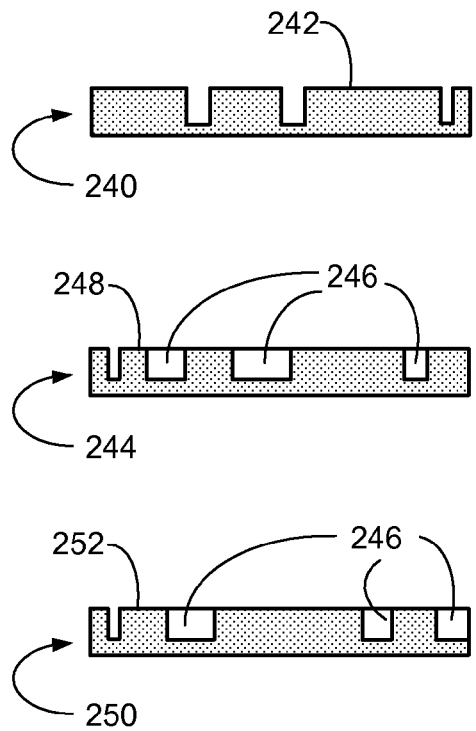
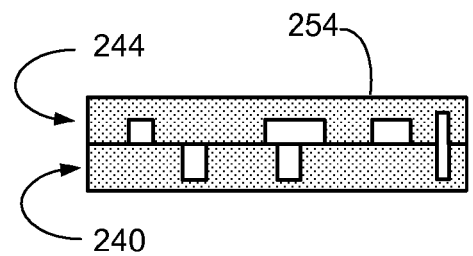
FIG. 9B
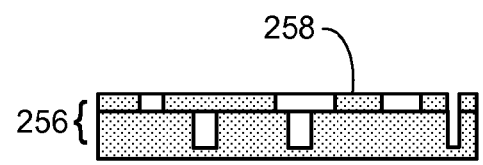
FIG. 9C
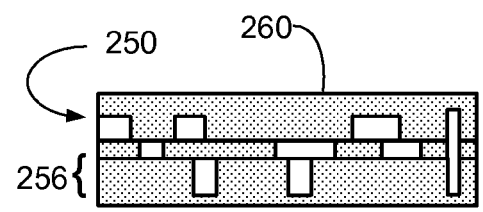
FIG. 9D
FIG. 9A
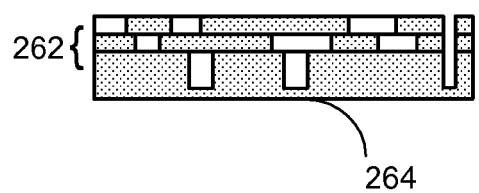
FIG. 9E
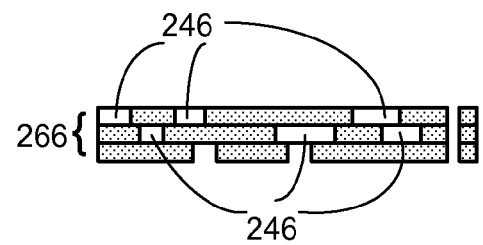
FIG. 9F
FIG. 9G

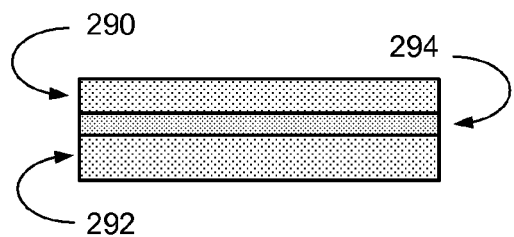
FIG. 11A
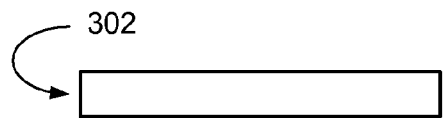
FIG. 12A
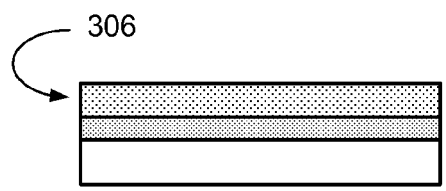
FIG. 12B
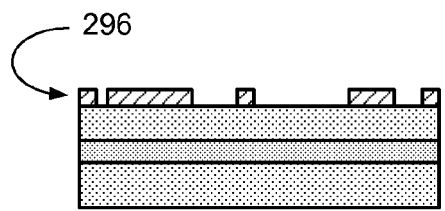
FIG. 11B
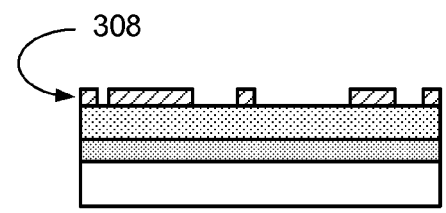
FIG. 12C
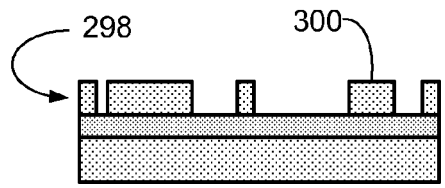
FIG. 11C
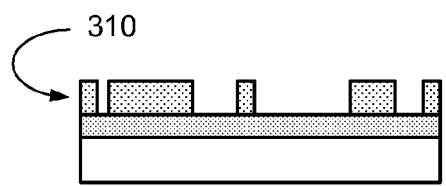
FIG. 12D
FIG. 12E

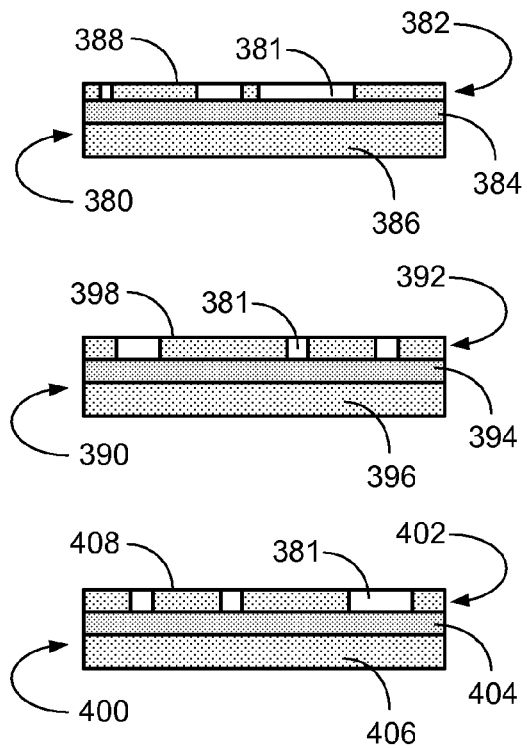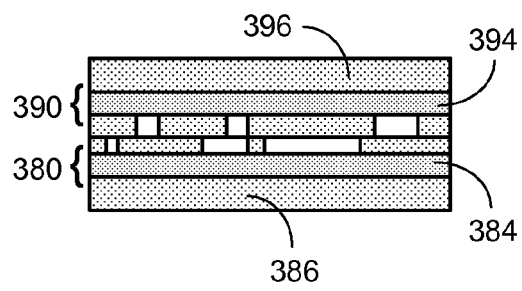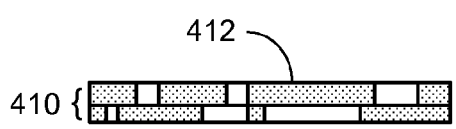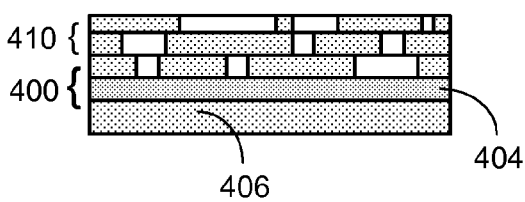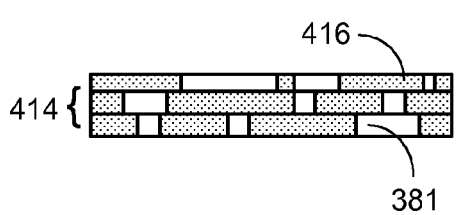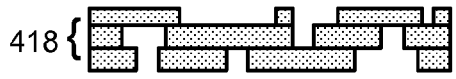
FIG. 16A
FIG. 16B
FIG. 16C
FIG. 16D
FIG. 16E
FIG. 16F

METHODS FOR FORMING MULTI-LAYER SILICON STRUCTURES

CROSS-REFERENCE TO RELATED APPLICATIONS

This application claims the benefit of provisional patent application Ser. No. 60/826,033, filed Sep. 18, 2006 by the present inventor.

FIELD OF THE INVENTION

This invention generally relates to forming multi-layer structures. More particularly, it relates to fabrication processes for fabricating multi-layer three-dimensional (3-D) meso and micro silicon structures by separately fabricating a plurality of individual layers and/or individual groups of layers of fabrication materials and then attaching them together.

BACKGROUND OF THE INVENTION

MEMS (Microelectromechanical Systems) technology enables to fabricate microdevices with reduced size, weight, cost and power demanding, and yet with improved performance, functionality and reliability. In silicon micromachining, currently there is no fabrication technology available for the manufacture of virtually arbitrary, complex 3-D silicon microdevices. Therefore, current silicon microdevices suffer from fairly simple geometries defined only by one to five layers, i.e., either high-aspect-ratio 2.5-D structures by silicon bulk micromachining or low-aspect-ratio planar (2-D) structures by silicon surface micromachining, so that complex MEMS devices with high-performance are extremely hard to be realized.

The only way to realize relatively complex silicon microdevices is the bonding of pre-micromachined silicon microstructures, i.e., bulk micromachining plus silicon bonding. One well-known example is the micro gas turbine engine fabricated by bonding five layers of pre-micromachined silicon wafers (see Luc G. Fréchette et al, "High-Speed Microfabricated Silicon Turbomachinery and Fluid Film Bearings", Journal of Microelectromechanical Systems, Vol. 14, No. 1, pp. 141-152 (2005)). However, this technology has its intrinsic drawbacks and is only suitable for building devices with limited 3-D geometries. The drawbacks are summarized as follows.

If we divide a truly 3-D microdevice into multiple layers along its z-axis, we will find that one or more of the layers comprise discrete features. A discrete feature means that it does not mechanically connect with other features on the same layer. Obviously this kind of layer cannot be made separately as discrete features will fall down. This is a fundamental drawback in bulk micromachining plus silicon bonding. To overcome this technical barrier, special fabrication approaches have to be implemented. For example, for making the layers containing discrete features, one solution is to use temporary silicon connections which support discrete silicon features. After all layers are bonded together, the temporary silicon connections are then cut to release the discrete features. However, this post-treatment only works for special designs. In addition, it is not a reliable and desirable approach as the removal of the mechanical connections is the last step of the process. If it fails, all previous work will be wasted. To avoid making the layers containing discrete features, one solution is to do multiple etching on both sides of layers. However, deep etching can be performed only once on each side of a layer, which restricts to form more complex structures. Besides, this solution involves many process steps and faces difficult operations, low throughput and low yield.

Another intrinsic drawback of this technology (bulk micromachining plus silicon bonding) is related to deep etching processes such as DRIE (Deep Reactive Ion Etching). The DRIE etch rate distributes non-uniformly both locally and globally over a wafer depending on feature geometry and feature distribution. Although the etch parameters of DRIE can be adjusted to an extent to lessen this effect, non-uniformity cannot be avoided. In addition, after DRIE, one has to accept as-is for both etched depth non-uniformity and etched surface smoothness since there does not exist a post-treatment process for improving non-uniformity and smoothness.

Summarily, although bulk micromachining plus silicon bonding is the way to form complex silicon microstructures, the intrinsic drawbacks of this technology restrict it to build limited 3-D microstructures and make it a quite complicated and low yield process as well. Because of the limitations of current silicon micromachining technologies, microdevices have to be designed to fit into the capabilities of silicon micromachining so that desired features have to be compromised or even sacrificed, and optimal performance usually cannot be achieved.

The present inventor invented a technique for forming multi-layer 3-D structures (e.g., parts, components, devices, and the like) by separately fabricating a plurality of individual layers and/or individual groups of layers of fabrication materials and then attaching them together. This technique is dubbed as Assemblayer™. It was disclosed in U.S. Non-Provisional patent application Ser. No. 11/278,137 filed Mar. 30, 2006 and U.S. Non-Provisional patent application Ser. No. 11/548,207 filed Oct. 10, 2006 by the present inventor. These two applications are hereby incorporated herein by reference as if set forth in full herein.

The Assemblayer™ technique applies the concept of Rapid Prototyping (RP) or Solid Freeform Fabrication (SFF) to multi-layer 3-D microfabrication in which an object with arbitrary 3-D geometry can be made by stacking a series of 2-D layers. As one or more of the 2-D layers may contain discrete features, a sacrificial material is thus used to function as an "adhesive" which combines the discrete features together on each of these layers. Otherwise the layers containing discrete features cannot be made. It is this unique use of sacrificial material that not only makes it possible to make 2-D layers containing discrete features, but also distinguishes Assemblayer™ from other microfabrication technologies. Unlike RP or SFF, the core of Assemblayer™ is to fabricate a plurality of individual layers and/or individual groups of layers of fabrication materials wherein at least one of the layers comprises at least one structural material and at least one sacrificial material. The structural material features on the layers compose desired 3-D microstructures. These layers are then aligned (if necessary) and attached together to form a multilayer structure. Finally the sacrificial material is removed to release the desired multi-layer 3-D structures. Note that in some cases if a sacrificial material does not influence what a multi-layer structure is designed to do, part or all of it may be left untouched.

When Assemblayer™ is used to fabricate structures comprising silicon, the resulting manufacturing process is dubbed as Si-Assemblayer™.

SUMMARY OF THE INVENTION

A first aspect of the invention provides a method for fabricating a multi-layer silicon structure, including: (1) forming a plurality of individual single layers and/or individual groups of layers wherein each layer comprises at least silicon forming a desired pattern and wherein at least one of the layers comprises at least one sacrificial material; (2) attaching at least the plurality of individual single layers and/or individual groups of layers together to form a multi-layer silicon structure; and (3) if it is desired, removing at least a portion of at least one of the at least one sacrificial material from the formed multi-layer silicon structure to form a final multi-layer silicon structure.

A second aspect of the invention provides a method for fabricating a multi-layer silicon structure, including: (1) forming a plurality of individual single layers and/or individual groups of layers wherein each layer comprises at least silicon forming a desired pattern, wherein at least one of the layers comprises at least one sacrificial material, and wherein a thickness of at least one of the plurality of individual single layer is thicker than a predetermined value; (2) attaching at least the plurality of individual single layers and/or individual groups of layers together to form a multi-layer silicon structure wherein after the at least one layer that is thicker than the predetermined value is attached to an another layer or other layers, its thickness is reduced to the predetermined value; and (3) if it is desired, removing at least a portion of at least one of the at least one sacrificial material from the formed multi-layer silicon structure to form a final multi-layer silicon structure.

A third aspect of the invention provides a method for fabricating a one-layer silicon structure on a substrate, including: (1) providing a substrate; (2) forming an individual single layer wherein the individual single layer comprises at least silicon forming a desired pattern and wherein the individual single layer comprises at least one blind opening that may or may not be filled with at least one sacrificial material; (3) attaching the individual single layer onto the desired surface and area of the substrate to form a one-layer silicon structure on the substrate wherein the individual single layer surface attached to the substrate is the surface through which the at least one blind opening is formed; (4) planarizing the individual single layer so that the at least one blind opening is exposed and the individual layer reaches a predetermined thickness; and (5) if the individual single layer comprises at least one sacrificial material, removing at least a portion of at least one of the at least sacrificial material if it is desired.

A fourth aspect of the invention provides a method for fabricating a multi-layer silicon structure, including: (1) providing a substrate if needed; (2) forming a plurality of individual single layers wherein each layer comprises at least silicon forming a desired pattern and wherein each layer comprises at least one blind opening that may or may not be filled with at least one sacrificial material; (3) attaching a desired layer onto the desired surface and area of the substrate, an another desired layer, or a previous attached layer to form a multi-layer structure wherein the surface of the desired layer attached is the surface from which the at least one blind opening of the desired layer is formed; (4) planarizing at least the attached desired layer so that at least the at least one blind opening of the attached desired layer is exposed and at least the attached desired layer reaches a predetermined thickness, flatness and smoothness; (5) if the formed multi-layer structure comprises at least one sacrificial material, removing at least a portion of at least one of the at least sacrificial material if it is desired; (6) repeating the steps of (3) to (5) to attach a next desired layer until all the layers are attached to form a whole multi-layer silicon structure; and (7) if the formed whole multi-layer silicon structure still comprises at least one sacrificial material, removing at least a portion of at least one of the at least sacrificial material to form a final multi-layer silicon structure if it is desired.

A fifth aspect of the invention provides a method for fabricating an at least one-layer silicon structure on a substrate, including: (1) providing a first substrate; (2) forming at least one layer on a second substrate wherein the formed at least one layer comprises at least silicon forming a desired pattern and wherein the formed at least one layer may or may not comprises at least one sacrificial material; (3) attaching the formed at least one layer onto the desired surface and area of the first substrate; (4) separating the second substrate from the formed at least one layer; and (5) if the formed at least one layer comprises at least one sacrificial material, removing at least a portion of at least one of the at least sacrificial material to form a final silicon structure if it is desired.

A sixth aspect of the invention provides a method for fabricating a multi-layer silicon structure, including: (1) providing a substrate if needed; (2) forming a plurality of structures wherein each structure comprises at least one layer that is formed on a temporary substrate wherein the formed at least one layer comprises at least silicon forming a desired pattern and wherein the formed at least one layer may or may not comprises at least one sacrificial material; (3) attaching the at least one layer of a desired structure onto the desired surface and area of the substrate, an at least one layer of an another desired structure, or a previous attached layer or previous attached layers from a previous desired structure; (4) separating at least the temporary substrate of the attached desired structure from the at least one layer of the attached desired structure to form a multi-layer structure; (5) if necessary, planarizing at least the top surface of the attached at least one layer so that the top surface reaches a flatness and smoothness suitable for next attaching operation; (6) if the formed multi-layer silicon structure comprises at least one sacrificial material, removing at least a portion of at least one of the at least sacrificial material if it is desired; (7) repeating the steps of (3) to (6) to attach a next desired structure till a last desired structure to form a whole multi-layer silicon structure; (8) if the formed whole multi-layer silicon structure still comprises at least one sacrificial material, removing at least a portion of at least one of the at least sacrificial material to form a final multi-layer silicon structure if it is desired.

Other aspects of the invention may implement combinations of the above aspects of the present invention, repetition of all steps or some of the steps in some of the above aspects of the present invention, and other configurations, structures and processes which have not been specifically set forth above. Further aspects of the invention will become apparent from a consideration of the drawings and the ensuring description of preferred embodiments of the present invention.

It is an advantage of one or some aspects of the invention to provide a method for forming complex multi-layer three-dimensional structures comprising micro-scale and/or meso-scale silicon features.

It is an advantage of one or some aspects of the invention to provide a method for forming multi-layer three-dimensional silicon structures by attaching a plurality of individual single layers and/or individual groups of layers together where at least one of the layers comprises at least one sacrificial material that combines discrete silicon features on the same layer together.

It is an advantage of one or some aspects of the invention to provide a method for forming multi-layer three-dimensional silicon structures by using a parallel fabrication approach so that it can produce a high production throughput.

It is an advantage of one or some aspects of the invention to provide a method for forming multi-layer three-dimensional silicon structures, which can produce a high yield of multi-layer three-dimensional silicon structures.

It is an advantage of one or some aspects of the invention to provide a method for forming multi-layer three-dimensional silicon structures where in addition to single crystal silicon, polycrystalline silicon can also be used as a structural material of multi-layer three-dimensional silicon structures.

It is an advantage of one or some aspects of the invention to provide a method for forming multi-layer three-dimensional silicon structures where a thickness of each layer in a broad range can be realized.

It is an advantage of one or some aspects of the invention to provide a method for forming multi-layer three-dimensional silicon structures comprising at least one extremely thin layer.

Further advantages of various aspects and embodiments of the present invention will be apparent to those of skill in the art upon review of the teachings herein. It should be noted that the various aspects of the invention may address one or more of the above advantages alone or in combination. It should be also noted that It is not necessarily intended that all advantages be addressed by any single aspect of the invention event though that may be the case with regard to some aspects.

BRIEF DESCRIPTION OF THE DRAWINGS

FIGS. 9A-9G show a second example of the third embodiment of the invention in which side views at various stages of a process for forming a three-layer silicon structure without a substrate are schematically depicted.

FIGS. 11A-11C show a first example, which schematically depict side views at various stages of a process for forming a patterned silicon layer on a substrate according to Block 282 of the fourth embodiment.

FIGS. 12A-12E show a second example, which schematically depict side views at various stages of a process for forming a patterned polysilicon layer on a substrate according to Block 282 of the fourth embodiment.

FIGS. 16A-16F show a second example, which schematically depict side views at various stages of a process for forming a three-layer silicon structure according to the fifth embodiment of the invention.

DETAILED DESCRIPTION OF PREFERRED EMBODIMENTS OF THE INVENTION

Figure 1:
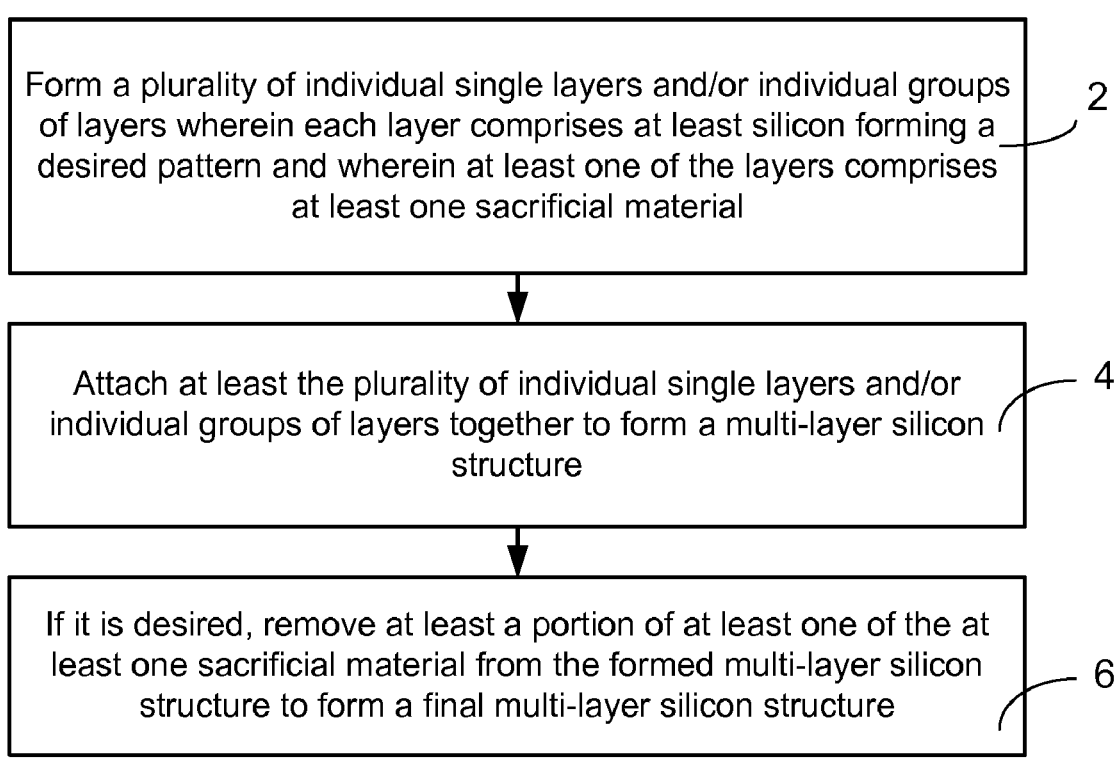
FIG. 1 provides a block diagram of a process of a first generalized embodiment of the present invention where a multi-layer silicon structure is formed via forming and attaching at least a plurality of individual single layers and/or individual groups of layers together.

FIG. 1 provides a block diagram of a process of a first generalized embodiment of the present invention where a multi-layer silicon structure is formed via forming and attaching at least a plurality of individual single layers and/or individual groups of layers together.

Block 2 of FIG. 1 calls for forming a plurality of individual single layers and/or individual groups of layers which compose at least a portion of a desired multi-layer silicon structure. Each layer comprises at least silicon which forms a desired pattern and at least one of the layers comprises at least one sacrificial material. Various processes for building various individual single layers and individual groups of layers have been disclosed in U.S. Non-Provisional patent application Ser. No. 11/278,137 filed Mar. 30, 2006 and U.S. Non-Provisional patent application Ser. No. 11/548,207 filed Oct. 10, 2006 by the present inventor. These two applications are hereby incorporated herein by reference as if set forth in full herein.

Block 4 of FIG. 1 calls for attaching at least the plurality of individual single layers and/or individual groups of layers together to form a multi-layer silicon structure. Attaching techniques for block 4 may include, but not limited to, the use of silicon bonding techniques. Silicon bonding techniques may include fusion bonding, plasma activation silicon direct bonding, adhesive bonding, eutectic bonding, thermal-compression bonding, anodic bonding, and the like. These silicon bonding techniques have become standard manufacturing techniques used in the fabrication and packaging of MEMS devices. The detailed information of these bonding techniques can be found in books, literature, patents, etc. One paper titled as "Advanced techniques for 3D devices in wafer-bonding processes" by V. Dragoi et al. in Solid State Technology (Volume 47, Issue 6, pp 55-58 (2004)) is hereby incorporated herein by reference as if set forth in full herein.

Attaching operations may be implemented in a variety of different ways. In some cases only one attaching technique may be used. In some cases a combination of different attaching techniques may be used together. Still in some cases one attaching technique or a combination of attaching techniques may be used for some layers and another attaching technique or another combination of attaching techniques may be used for other layers. Those skilled in the art will understand that there are many other different ways to use attaching techniques.

Block 6 of FIG. 1 calls for, if it is desired, removing at least a portion of at least one of the at least one sacrificial material from the formed multi-layer silicon structure to form a desired final multi-layer silicon structure. Note that the main function of sacrificial material is to combine discrete silicon features together. If the existence of sacrificial material does not influence what a multi-layer silicon structure is designed to do, it may be left untouched.

Removing techniques for block 6 may include chemical dissolution, electrochemical dissolution, dry etching (e.g., plasma etching), vaporization, mechanical means, and the like. Removing operations may be implemented in a variety of different ways. In some cases only one removing technique may be used. In some cases a combination of different removing techniques may be used together. Still in some cases one removing technique or a combination of removing techniques may be used for some layers and another removing technique or another combination of removing techniques may be used for other layers. Those skilled in the art will understand that there are many other different ways to use removing techniques.

In order that those skilled in the art will be better able to practice the present invention, the following examples are given by way of illustration and not by way of limitation.

A first example is shown in FIGS. 2A-2I which schematically depict side views at various stages of a process for forming a multi-layer silicon structure by forming and attaching six individual single layers according to the first embodiment of the invention.

Figure 2A:
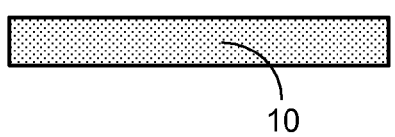
FIGS. 2A-2I show a first example of the first embodiment of the invention in which side views at various stages of a process for forming a multi-layer silicon structure by forming and attaching six individual single layers are schematically depicted.

In FIG. 2A, a double-side polished silicon wafer 10 with a proper thickness is provided.

Figure 2B:
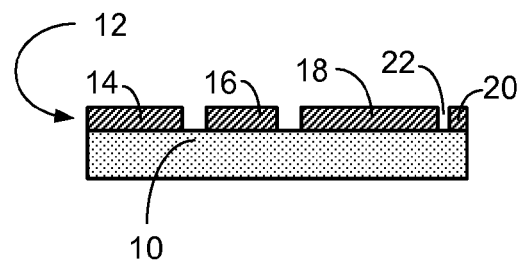

Many methods may be used to selectively etch the silicon wafer 10 to form a desired pattern, e.g., laser micromachining, wet chemical etching, or DRIE (Deep Reactive Ion Etching). In this example, DRIE is used to pattern the silicone wafer 10. In FIG. 2B, a DRIE etch mask such as a photoresist (e.g., AZ4620) is applied and UV-exposed through a photomask (not shown) to form a photoresist pattern layer 12 on the silicon wafer 10 with a standard cleanroom photolithography process. The photoresist layer 12 comprises photoresist features 14, 16, 18 and 20. An opening 22 in the photoresist layer 12 is specially designed to be used to generate an alignment reference mark in the silicon wafer 10. The purpose of alignment marks is for aligning the layers for the final bonding to form a multi-layer structure. As an example, suitable alignment marks may be holes formed in the silicon wafer 10.

Figure 2C:
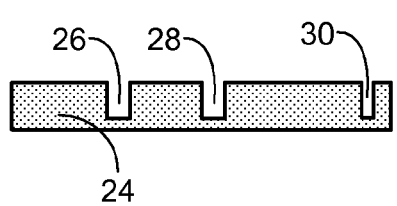

The whole combination (silicon wafer 10 and photoresist layer 12) is placed in a DRIE machine. The silicon which is not covered with the photoresist 14, 16, 18 and 20 is etched away until to the desired depth from the top surface of the silicon wafer 10. In this example, the silicon wafer 10 is not etched through the whole thickness of the silicon wafer 10. This silicon layer may or may not have discrete silicon features. If a silicon layer does not have any discrete silicon features, we may etch through it if this is desired. However, if a silicon layer has discrete silicon features, we should not etch through it as the discrete silicon features will fall apart if we do so. FIG. 2C shows that a silicon mold 24 is formed after DRIE and after the removal of the photoresist layer 12. The silicon mold 24 comprises blind openings 26, 28 and 30. The opening 30 is an alignment mark in the silicon mold 24. Note that there could be more than one alignment mark in the silicon 24. FIG. 2C only shows one for the purpose of illustration. A cleaning process such as oxygen plasma may be used to remove residues generated during DRIE on the exposed silicon areas.

A sacrificial material 34 is then filled into the openings of the silicon mold 24 to form a two-material composite layer. Before this filling operation, we first use a piece of tape 32 to seal the opening 30 as we want to keep the alignment mark unfilled. Note that if a silicon layer does not have discrete silicon features, we may choose to not fill a sacrificial material as the main function of a sacrificial material is to combine discrete silicon features together. However, a micromachined silicon layer is usually quite fragile. In addition, unprotected, bare microstructures may be easily destroyed if they come in contact with a physical object during transportation and attaching operations. It is therefore desired to use sacrificial material as it can enhance the robustness of micromachined silicon layers or structures.

The sacrificial material 34 may be a metal that may be deposited into the openings by using electrochemical deposition, vacuum deposition, cold spray, hot spray or the like. For example, copper may be electrodeposited into the silicon mold 24. Deposition of metals into silicon molds is a common practice in the microelectronics industry and MEMS industry. Alternatively, the sacrificial material 34 may be a polymer material which may be sprayed or spread to fill the openings. For example, we may use an epoxy or polymethylmethacrylate (PMMA) to fill the openings. A suitable epoxy is EPO-TEK® 353ND manufactured by Epoxy Technology, Inc. This epoxy is used in semiconductor applications such as wafer-wafer bonding; fabrication of MEMS devices; and flip chip underfill. A specially good property of this epoxy is that it can be used up to 325° C. Therefore it is compatible with low temperature plasma activation silicon bonding. It is a two-part epoxy. For using this epoxy to fill the silicon mold 24, we first mix the two parts together with the right ratio. Then we spread mixed epoxy 34 onto the silicon 24 to fill the epoxy into the openings shown in FIG. 2D. We may put the silicon 24 and the epoxy 34 into a vacuum chamber to remove bubbles in the epoxy 34 to avoid the formation of voids after the epoxy 34 is cured. Then we cure the epoxy to form a two-material composite layer 36 shown in FIG. 2D.

Figure 2D:
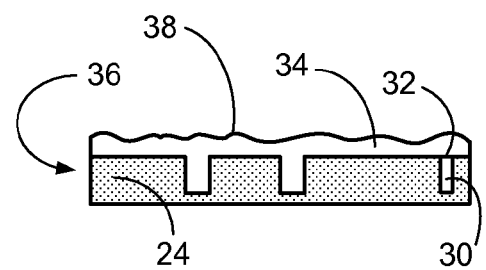
Figure 2E:
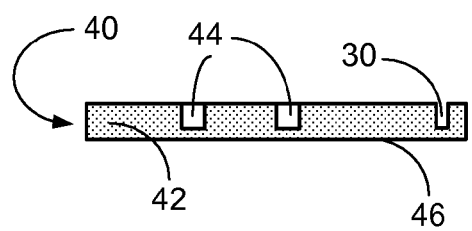

The top surface 38 of the two-material layer 36 shown in FIG. 2D is then planarized with diamond lapping, CMP (chemical mechanical polishing) or the like to form a two-material layer 40 shown in FIG. 2E. After planarization, the top surface of the silicon 42 is exposed and has the same level as the surfaces of sacrificial material features 44; the top surface of the layer 40 reaches required flatness and smoothness; and the layer 40 also reaches a required thickness. The alignment mark 30 is clear of the sacrificial material after this operation.

Figure 2F:
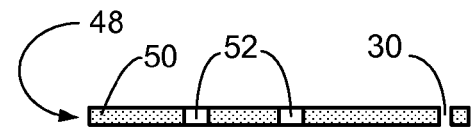

The bottom surface 46 of the layer 40 in FIG. 2E is then planarized to form a two-material layer 48 shown in FIG. 2F. Again after planarization, the bottom surfaces of sacrificial material features 52 are exposed and have the same level as the bottom surfaces of silicon features 50; the bottom surface of the layer 48 reaches required flatness and smoothness; and the layer 48 also reaches a final thickness. In addition, it is usually desired that the front side and the backside surfaces of the two-material layer 48 are substantially parallel after the operation of planarization.

Alternatively, both the front side surface and the backside surface of the composite layer 36 shown in FIG. 2D may be planarized simultaneously by using a planarization machine which is capable of treating the both sides of a sample at the same time.

Figure 2G:
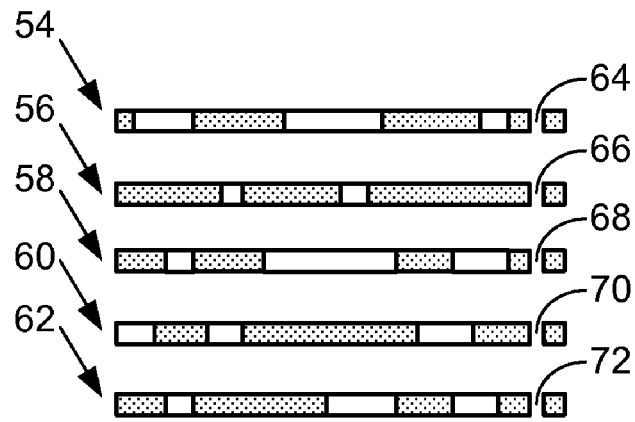

The above steps shown in FIGS. 2A-2F are repeated to build all required single layers 54, 56, 58, 60 and 62 shown in FIG. 2G. The alignment marks on these layers are 64, 66, 68, 70 and 72, respectively. Then the six single layers are aligned with the aid of the alignment marks and bonded together by using direct silicon bonding or silicon fusion bonding to form a multi-layer structure 74 shown in FIG. 2H. Note that these six layers may be bonded together at one time (i.e., in a parallel mode) or may be bonded together more than once (i.e., in a series mode).

Direct silicon wafer bonding has become a standard MEMS manufacturing technology. Some MEMS equipment manufacturers such as EV Group supplies aligned wafer bonding systems which have a bonder aligner for performing alignment and a vacuum bond chamber for bonding silicon wafers. Some advanced systems can handle multiple silicon wafers. It is reported that a typical alignment accuracy of ±1 µm can be achieved. This technology requires a very low surface roughness (≦5 Å) and a high surface flatness on the order of 5 µm on a 4" wafer. Therefore, the operation of planarization must achieve these requirements. In this example, the bonding of six layers involves two different materials (silicon and the sacrificial material) instead of one silicon material in standard silicon direct bonding. As silicon direct bonding is possibly operated at temperatures up to 1000° C., the mismatch in the coefficient of thermal expansion between the silicon and the sacrificial material might induce thermal stress that might distort silicon structures. With the advance of silicon direct bonding, the current technology can bond silicon wafers at much lower temperatures (e.g., <300° C.), even at room temperature. There are two methods for minimizing the influence of thermal effect.

Method 1: Use room temperature or low temperature plasma activation bonding. Low temperature is to be understood to means herein a temperature less than 300° C. This technology applies plasma to generate a molecular level surface modification on silicon, which allows low temperature bonding. With the aid of plasma activation, the bonding temperature can be dramatically decreased. High strength bonding can even be reached at room temperature. For example, SUSS' nanoPREP Module nP200 uses a novel method of surface activation with direct silicon bonding that reduces process temperatures from above 1000° C. down to 200° C.

Method 2: Use a 3-step process including initial bonding, sacrificial material etching and final annealing. The strength of a silicon-silicon bond is a function of both time and temperature. In this 3-step process we first do an initial bonding at room temperature or at a low temperature (e.g., plasma activation bonding) so as to form a not very strong bond strength between silicon structures, but which is enough to survive the next step, etching of sacrificial material. The idea of the initial bonding is to just hold all the silicon microstructures together so that the bond can survive the sacrificial material etching. In addition, the bonding temperature will not cause significant thermal stress. Then we etch away the sacrificial material. Finally we anneal the bonded multilayer silicon structure to obtain a full bonding strength at a suitable high temperature. As there is no sacrificial material involved in the final high temperature bonding, thermal stress would not be a problem.

Figure 2H:
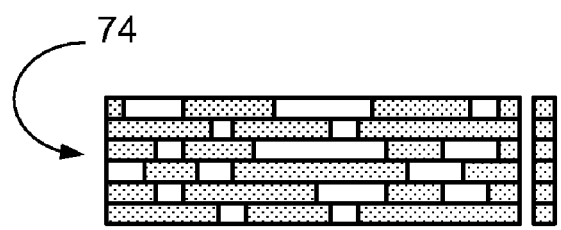

FIG. 2H shows the six layers which have been stacked according to the predetermined configuration, aligned with the aid of the alignment reference marks, and bonded together with either of the two methods discussed above to form a multi-layer silicon structure 74. An alignment equipment or a precision fixture with an suitable microscope may be used for the alignment task.

Figure 2I:
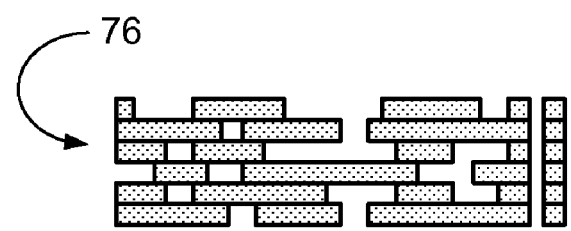

In FIG. 2I, the sacrificial material 34 has been removed and a final multi-layer silicon structure is formed. The requirements of this removing operation include no significant damage to the silicon features, no damage to weaken the adhesion between the silicon layers, fast removal rate, and the complete removal of the sacrificial material. For removing a metal sacrificial material, we can use a proper metal etchant. For example, if the sacrificial material is copper, it may be etched in an ammoniacal copper etching solution such as Enstrip C-38 manufactured by Enthone Inc.

If the sacrificial material is a polymer such as epoxy, there are at least two approaches for the removal of epoxy. One approach is to use chemicals to strip the epoxy such as using various commercial epoxy removers. In this case, we may immerse the multi-layer silicon structure 74 in a proper chemical etching solution. We may also use ultrasonic vibration to enhance etching efficiency. The other inexpensive, reliable, and fast approach is to burn or pyrolyze the epoxy at 450° C. or up. The latter approach is effectively used for removing SU-8 (an epoxy-type photoresist) from silicon in the MEMS industry. The burning or pyrolyzing method may also work for non-epoxy polymer materials such as PMMA.

In some cases, it may be desired to attach a multi-layer silicon structure on a substrate. A substrate in the present invention may be a pure solid or porous substrate the material of which may be a metal, alloy, dielectric, composite, polymer, or semiconductor and which may have one or more coatings on which a multi-layer silicon structure will be attached. A substrate may also be a device, a single layer structure, or a multi-layer structure. A substrate may comprise various components or openings. This attaching operation may be done before or after all the layers of a multi-layer silicon structure are bonded together. There are many attaching methods for this purposes, including, but not limited to, adhesive bonding, diffusion bonding, eutectic bonding, and anodic bonding.

A second example is shown in FIGS. 3A-3E which schematically depict side views at various stages of a process for forming a multi-layer silicon structure by attaching a five-layer silicon structure and an individual single silicon layer together according to the first embodiment of the invention.

Figure 3A:
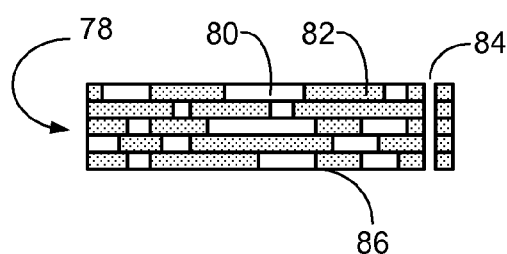
FIGS. 3A-3E show a second example of the first embodiment of the invention in which side views at various stages of a process for forming a multi-layer silicon structure by attaching a five-layer silicon structure and an individual single silicon layer together are schematically depicted.

FIG. 3A shows a five-layer silicon structure 78 each layer of which comprises silicon 82 and a sacrificial material 80 and which also has an alignment reference mark 84. The structure 78 may be made with the process described in the first example.

Figure 3B:
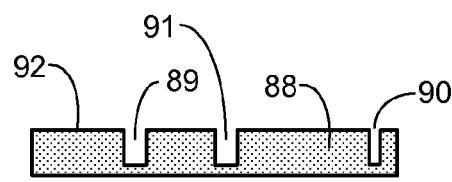

FIG. 3B shows a silicon mold 88 which comprises three blind openings 89, 90 and 91. The blind opening 90 is also an alignment reference mark. The mold 88 may be made with the process described in the first example shown in FIGS. 2A-2C.

Figure 3C:
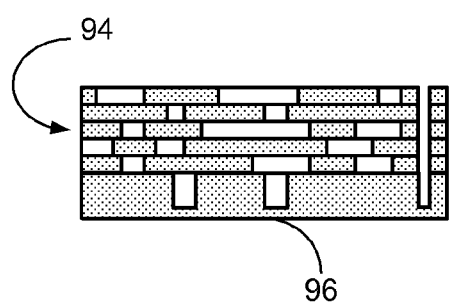

In FIG. 3C, the structure 78 is aligned with the silicon mold 88 and then attached together with a suitable silicon bonding technique to form a new silicon structure 94. Two bonding surfaces 86 and 92 must meet the bonding requirements such as flatness and smoothness.

Figure 3D:
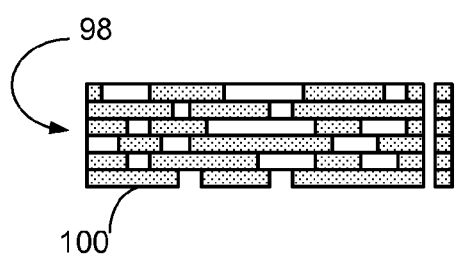

Surface 96 of the structure 94 shown in FIG. 3C is planarized until the thickness of the silicon mold 88 reaches a predetermined value and surface 100 of a new multi-layer silicon structure 98 shown in FIG. 3D reaches a predetermined flatness and smoothness. In this example, three openings 89, 90 and 91 in the silicon mold 88 are exposed after planarization.

Figure 3E:
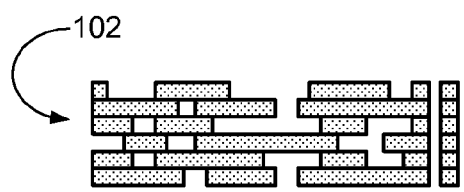

In FIG. 3E, the sacrificial material 80 has been removed and a final multi-layer silicon structure 102 is formed.

The process described in the second example of the first embodiment is especially useful to form a thin silicon layer (e.g., less than 100 µm) in a multi-layer silicon structure as an individual thin silicon layer is fragile and therefore difficult to handle.

Those skilled in the art will understand that the process steps shown in FIGS. 3C-3D may be repeated a plurality of times to bond a plurality of individual single silicon layers to form a desired multi-layer silicon structure.

A third example is shown in FIGS. 4A-4E which schematically depict side views at various stages of a process for forming a multi-layer silicon structure by attaching a five-layer silicon structure and an individual single silicon layer together according to the first embodiment of the invention.

Figure 4A:
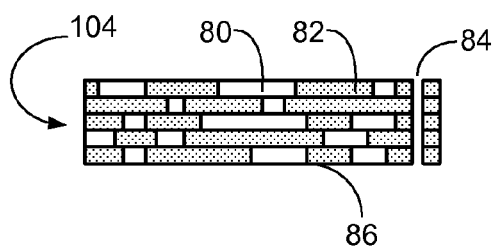
FIGS. 4A-4E show a third example of the first embodiment of the invention in which side views at various stages of a process for forming a multi-layer silicon structure by attaching a five-layer silicon structure and an individual single silicon layer together are schematically depicted.

FIG. 4A shows a five-layer silicon structure 104 which is exactly the same as the structure 78 shown in FIG. 3A.

Figure 4B:
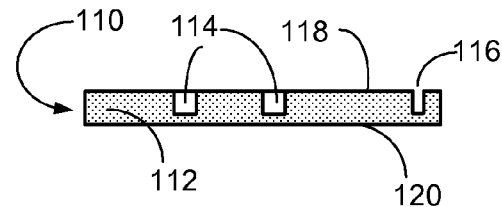

FIG. 4B shows a silicon layer 110 which comprises silicon 112, sacrificial material 114, and an alignment reference mark 116. The sacrificial material 114 is the same as the sacrificial material 80 of the structure 104. The silicon layer 110 may be made with the process described in the first example shown in FIGS. 2A-2E.

Figure 4C:
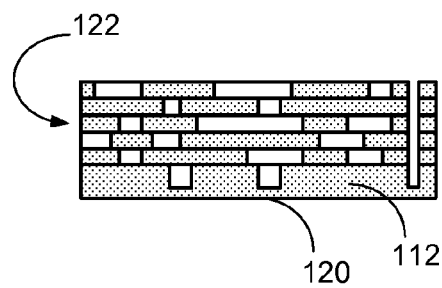

In FIG. 4C, the structure 104 is aligned with the silicon layer 110 and then attached together with a suitable silicon bonding technique to form a new silicon structure 122. Two bonding surfaces 86 and 118 must meet the bonding requirements such as flatness and smoothness.

Figure 4D:
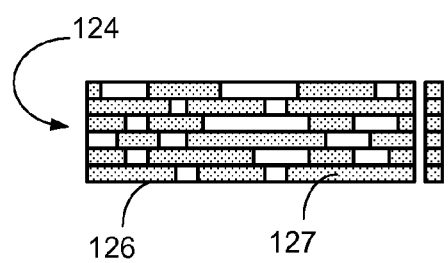

Surface 120 of the structure 122 shown in FIG. 4C is planarized until the thickness of the silicon layer 110 reaches a predetermined value. A new multi-layer silicon structure 124 is formed, which is shown in FIG. 4D. In this example, the bottom surfaces of the sacrificial material 114 are exposed and have the same level as the bottom surfaces of silicon features 127 after planarization. In addition, bottom surface 126 of the structure 124 reaches required flatness and smoothness.

Figure 4E:
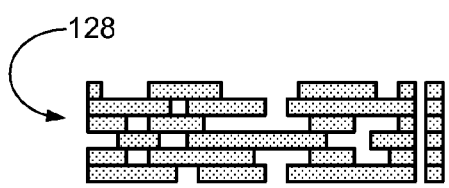

In FIG. 4E, the sacrificial material 80 and 114 has been removed and a final multi-layer silicon structure 128 is formed.

Those skilled in the art will understand that the process steps shown in FIGS. 4C-4D may be repeated a plurality of times to bond a plurality of individual single silicon layers to form a desired multi-layer silicon structure.

Although the structure 104 is a five-layer silicon structure in this example, the structure 104 may also be a one-layer silicon structure, a silicon wafer, or just a substrate which is defined in the first example of the first embodiment.

Figure 5:
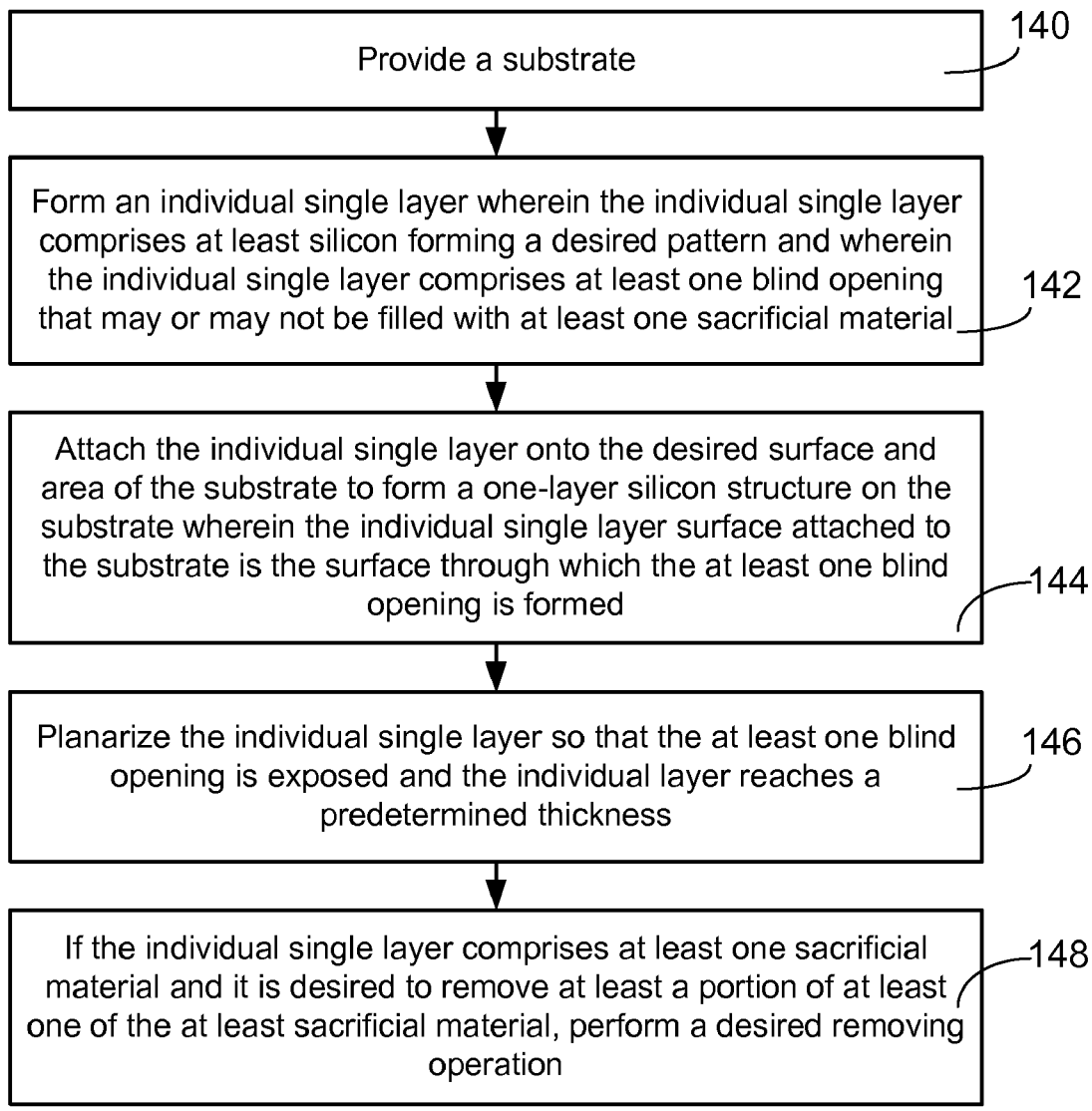
FIG. 5 provides a block diagram of a process of a second generalized embodiment of the present invention where a one-layer silicon structure is formed on a substrate via forming, attaching, and planarizing an individual single layer comprising silicon.

FIG. 5 provides a block diagram of a process of a second generalized embodiment of the present invention where a one-layer silicon structure is formed on a substrate via forming, attaching, and planarizing an individual single layer comprising silicon.

Block 140 of FIG. 5 calls for providing a substrate. Examples of some particularly suitable substrates include silicon wafer, silicon wafer with a layer of silicon dioxide (SiO$_2$), and glass.

Block 142 of FIG. 5 calls for forming an individual single layer wherein the individual single layer comprises at least silicon forming a desired pattern and wherein the individual single layer comprises at least one blind opening that may or may not be filled with at least one sacrificial material.

The bottom silicon of a blind opening has the same function of a sacrificial material in the present invention. In other words, the bottom silicon provides a mechanical connection for at least two discrete silicon features in a silicon layer.

Block 144 of FIG. 5 calls for attaching the individual single layer onto the desired surface and area of the substrate to form a one-layer silicon structure wherein the individual single layer surface attached to the substrate is the surface through which the at least one blind opening was formed.

Block 146 of FIG. 5 calls for planarizing the individual single layer so that the at least one blind opening is exposed and the individual single layer reaches a predetermined thickness. After this planarization operation, discrete silicon features that were connected with the bottom silicon of the at least one blind opening are separated. A desired silicon pattern is finalized. Note that if at least one of the at least one blind opening is filled with at least one sacrificial material, after this planarization operation, discrete silicon features related to the at least one of the at least one blind opening are still connected with the at least one sacrificial material.

Block 148 of FIG. 5 calls for performing a desired removing operation if the individual single layer comprises at least one sacrificial material and it is desired to remove at least a portion of at least one of the at least one sacrificial material.

In order that those skilled in the art will be better able to practice the present invention, the following example is given by way of illustration and not by way of limitation.

A first example is shown in FIGS. 6A-6F which schematically depict side views at various stages of a process for forming a one-layer silicon structure on a substrate according to the second embodiment of the invention.

Figure 6A:
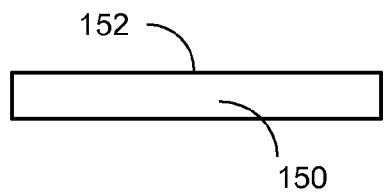
FIGS. 6A-6F show a first example of the second embodiment of the invention in which side views at various stages of a process for forming a one-layer silicon structure on a substrate are schematically depicted.

FIG. 6A shows a silicon substrate 150. Surface 152 of the silicon substrate 150 is flat, smooth and clean, which is suitable for silicon bonding.

Figure 6B:
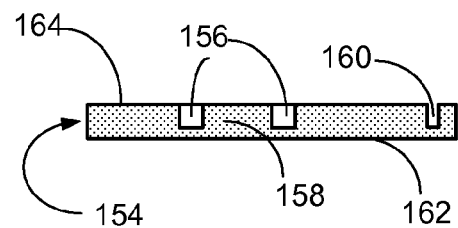

FIG. 6B shows a silicon layer 154 which contains three blind openings in silicon 158. Two of the blind openings are filled with a sacrificial material 156. The remainder blind opening 160 is empty. The silicon layer 154 may be made with the process described in the first example of the first embodiment shown in FIGS. 2A-2E. Surface 164 of the silicon layer 154 is flat, smooth and clean, which is suitable for silicon bonding.

Figure 6C:
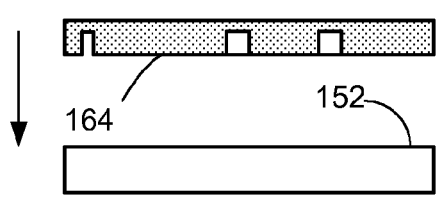

FIG. 6C shows that the silicon layer 154 is oriented so that surface 164 is to be bonded to the surface 152 of the silicon substrate 150. Note that the surface 164 is the surface through which three blind openings were formed in the silicon 158.

Figure 6D:
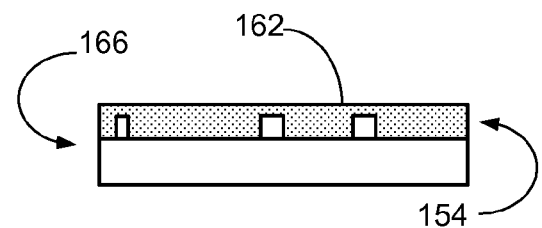

FIG. 6D shows that the silicon layer 154 has been bonded to the silicon substrate 150 by using a suitable silicon direct bonding technique. A structure 166 is formed.

Figure 6E:
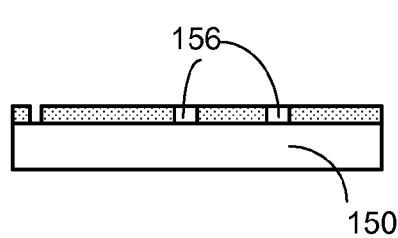

The silicon layer 154 of the structure 166 is planarized from surface 162 until the three blind openings are exposed and the thickness of the silicon layer 154 reaches a predetermined value. The result is shown in FIG. 6E.

Figure 6F:
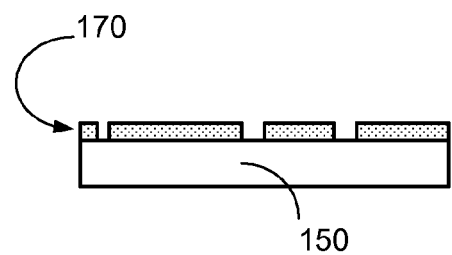

The sacrificial material 156 is then removed and a final one-layer silicon structure 170 is formed on the silicon substrate 150 shown in FIG. 6F.

Figure 7:
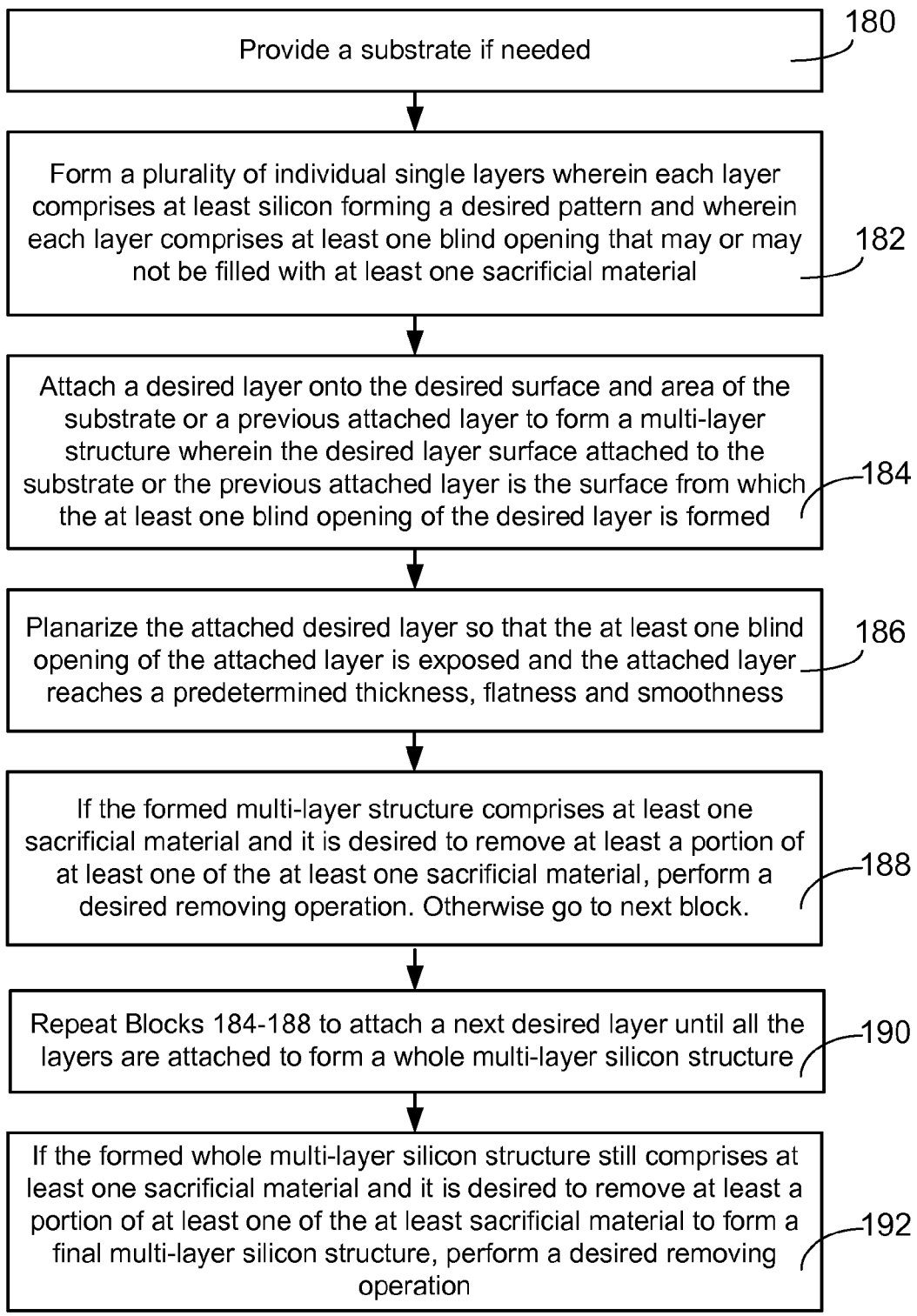
FIG. 7 provides a block diagram of a process of a third generalized embodiment of the present invention which is an extension of the second generalized embodiment for forming multi-layer silicon structures.

FIG. 7 provides a block diagram of a process of a third generalized embodiment of the present invention which is an extension of the second generalized embodiment for forming multi-layer silicon structures.

Block 180 of FIG. 7 calls for providing a substrate if needed.

Block 182 of FIG. 7 calls for forming a plurality of individual single layers wherein each layer comprises at least silicon forming a desired pattern and wherein each layer comprises at least one blind opening that may or may not be filled with at least one sacrificial material.

Block 184 of FIG. 7 calls for attaching a desired individual single layer onto the desired surface and area of the substrate or a previous attached layer to form a multi-layer structure wherein the desired layer surface attached to the substrate or the previous attached layer is the surface through which the at least one blind opening of the desired layer is formed. In the case that a substrate is not needed, we then attach two desired layers together as a first step. In such a case, technically either one of the two layers may be viewed as a substrate.

Block 186 of FIG. 7 calls for planarizing the attached desired layer so that the at least one blind opening of the attached layer is exposed and the attached layer reaches a predetermined thickness, flatness and smoothness. In the case that a substrate is not involved. After the first two desired layers has been attached and one of the two layers has been planarized, the other layer may be planarized so that its at least one blind opening is exposed and it reaches a predetermined thickness, flatness and smoothness. Alternatively, this planarization operation may be performed at any other time during building a multi-layer silicon structure.

Block 188 calls for making a decision. If the formed multi-layer structure comprises at least one sacrificial material and it is desired to remove at least a portion of at least one of the at least sacrificial material, then perform a desired removing operation. Otherwise go to next block 190.

Block 190 calls for repeating the steps from Block 184 to Block 188 to attach a next desired layer until all the layers are attached to form a whole multi-layer silicon structure.

Block 192 calls for making a decision. If the formed whole multi-layer silicon structure still comprises at least one sacrificial material and it is desired to remove at least a portion of at least one of the at least sacrificial material to form a final multi-layer silicon structure, then perform a desired removing operation.

In order that those skilled in the art will be better able to practice the present invention, the following examples are given by way of illustration and not by way of limitation.

A first example is shown in FIGS. 8A-8H which schematically depict side views at various stages of a process for forming a two-layer silicon structure on a substrate according to the third embodiment of the invention.

Figure 8A:
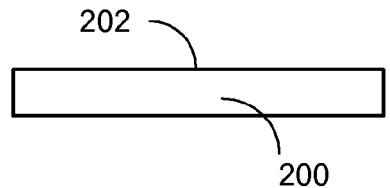
FIGS. 8A-8H show a first example of the third embodiment of the invention in which side views at various stages of a process for forming a two-layer silicon structure on a substrate are schematically depicted.

FIG. 8A shows a silicon substrate 200. Surface 202 of the silicon substrate 200 is flat, smooth and clean, which is suitable for silicon direct bonding.

Figure 8B:
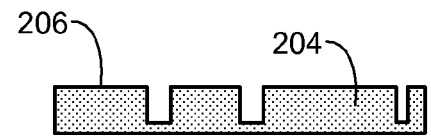

FIG. 8B shows a first silicon layer 204 which contains three blind openings that are not filled with sacrificial material. The silicon layer 204 may be made with the process described in the first example of the first embodiment shown in FIGS. 2A-2C. Surface 206 of the silicon layer 204 is flat, smooth and clean, which is suitable for silicon bonding.

Figure 8C:
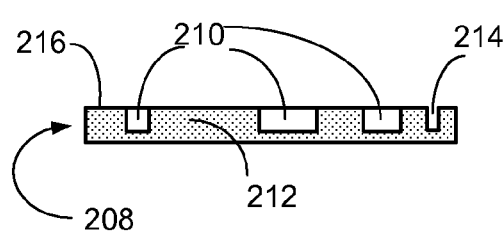

FIG. 8C shows a second silicon layer 208 which contains four blind openings in silicon 212. Three of the blind openings are filled with a sacrificial material 210. The remainder blind opening 214 is empty. The silicon layer 208 may be made with the process described in the first example of the first embodiment shown in FIGS. 2A-2E. Surface 216 of the silicon layer 208 is flat, smooth and clean, which is suitable for silicon bonding.

Figure 8D:
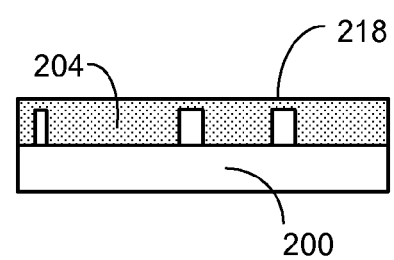

FIG. 8D shows that the substrate 200 and the first silicon layer 204 have been bonded together by using a suitable silicon bonding technique. The surfaces 202 and 206 are the surfaces that are bonded together.

Figure 8E:
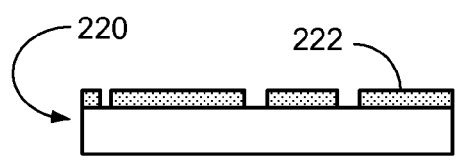

The first silicon layer 204 on the substrate 200 is planarized from surface 218 until the three blind openings are exposed and the thickness of the silicon layer 204 reaches a predetermined value. A resulting one-layer structure 220 is shown in FIG. 8E. New formed surface 222 is flat, smooth and clean, which is suitable for silicon bonding.

Figure 8F:
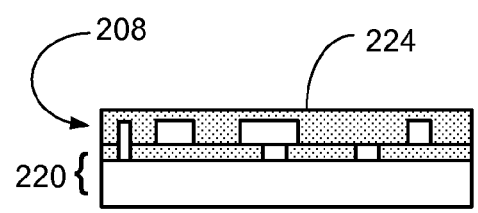

FIG. 8F shows that the structure 220 and the second silicon layer 208 have been bonded together by using a suitable silicon bonding technique. The surfaces 216 and 222 are the surfaces that are bonded together.

Figure 8G:
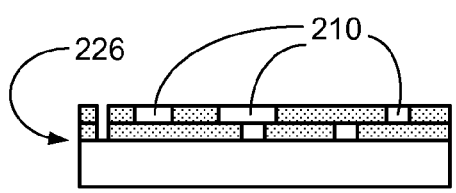

The second silicon layer 208 on the structure 220 is planarized from surface 224 until the four blind openings are exposed and the thickness of the silicon layer 208 reaches a predetermined value. A resulting two-layer structure 226 is shown in FIG. 8G.

Figure 8H:
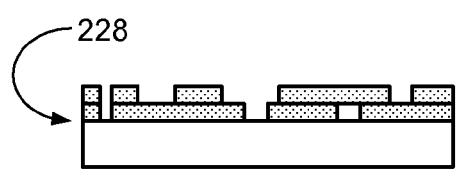

The sacrificial material 210 is then removed from the structure 226 and a final two-layer silicon structure 228 is formed shown in FIG. 8H.

A second example is shown in FIGS. 9A-9G which schematically depict side views at various stages of a process for forming a three-layer silicon structure without a substrate according to the third embodiment of the invention.

FIG. 9A shows three silicon layers 240, 244 and 250. The silicon layer 240 contains three blind openings that are not filled with sacrificial material. Surface 242 of the silicon layer 240 is flat, smooth and clean, which is suitable for silicon bonding.

The silicon layer 244 contains four blind openings. Three of the blind openings are filled with a sacrificial material 246. The remainder blind opening is empty. Surface 248 of the silicon layer 244 is flat, smooth and clean, which is suitable for silicon bonding.

The silicon layer 250 contains four blind openings. Three of the blind openings are filled with a sacrificial material 246. The remainder blind opening is empty. Surface 252 of the silicon layer 250 is flat, smooth and clean, which is suitable for silicon bonding.

The three silicon layers 240, 244 and 250 may be made with the process described in the first example of the first embodiment.

FIG. 9B shows that the silicon layer 240 and the silicon layer 244 have been bonded together by using a suitable silicon bonding technique. The surfaces 242 and 248 are the surfaces that are bonded together.

The bonded silicon layer 244 shown in FIG. 9B is planarized from surface 254 until the four blind openings are exposed and the thickness of the silicon layer 244 reaches a predetermined value. A resulting structure 256 is shown in FIG. 9C. New formed surface 258 is flat, smooth and clean, which is suitable for silicon bonding.

FIG. 9D shows that the silicon layer 250 and the structure 256 have been bonded together by using a suitable silicon bonding technique. The surfaces 252 and 258 are the surfaces that are bonded together.

The bonded silicon layer 250 shown in FIG. 9D is planarized from surface 260 until the four blind openings are exposed and the thickness of the silicon layer 250 reaches a predetermined value. A resulting structure 262 is shown in FIG. 9E.

The bottom silicon layer 240 shown in FIG. 9E is planarized from surface 264 until the three blind openings are exposed and the thickness of the silicon layer 240 reaches a predetermined value. A resulting structure 266 is shown in FIG. 9F.

The sacrificial material 246 in the structure 266 is then removed from the structure 266 and a final three-layer silicon structure 268 is formed shown in FIG. 9G.

Figure 10:
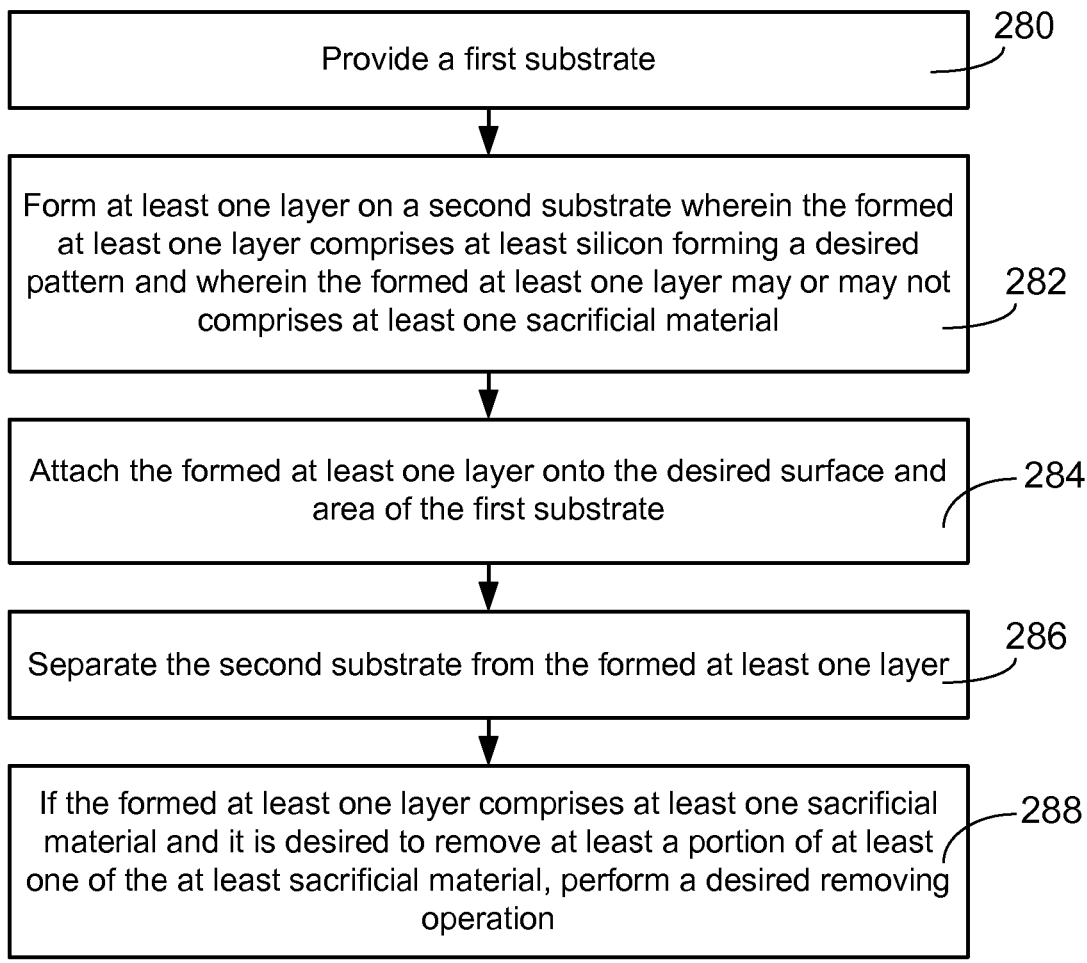
FIG. 10 provides a block diagram of a process of a fourth generalized embodiment of the present invention where an at least one-layer silicon structure is formed on a first substrate by first forming the at least one-layer silicon structure on a second substrate, then attaching the at least one-layer silicon structure onto the first substrate, and finally separating the second substrate from the at least one-layer silicon structure.

FIG. 10 provides a block diagram of a process of a fourth generalized embodiment of the present invention where an at least one-layer silicon structure is formed on a first substrate by first forming the at least one-layer silicon structure on a second substrate, then attaching the at least one-layer silicon structure onto the first substrate, and finally separating the second substrate from the at least one-layer silicon structure.

Block 280 of FIG. 10 calls for providing a substrate. Examples of some particularly suitable substrates include silicon wafer, silicon wafer with a layer of $SiO_2$, and glass.

Block 282 of FIG. 10 calls for forming at least one layer on a second substrate where the formed at least one layer comprises at least silicon forming a desired pattern and where the formed at least one layer may or may not comprises at least one sacrificial material.

To form one layer comprising at least silicon forming a desired pattern on a substrate, we may attach a bulk silicon layer on the substrate and micromachine (e.g., selectively etch) the bulk silicon layer for forming a desired pattern that may or may not be filled with other materials that may or may not comprise at least one sacrificial material. The substrate may or may not have a releasing layer on the surface onto which the bulk silicon layer is attached. Alternatively, we may use commercial SOI (silicon-on-insulator) wafers. An SOI wafer is a sandwich structure which has a $SiO_2$ layer in between two silicon wafers. In this case, we can selectively etch one of the wafers to form a desired layer. The $SiO_2$ layer and the other silicon wafer can be viewed as a substrate. The $SiO_2$ layer can be dissolved to release the formed desired layer and therefore acts as a releasing layer. Those skilled in the art understand that a two- or more-layer structure may be formed on the substrate by repeating the above steps of attaching, etching, and filling if needed. There are various methods for attaching and etching silicon layers, which can be found in the present invention, and in US Non-Provisional patent application Ser. No. 11/278,137 filed Mar. 30, 2006 and US Non-Provisional patent application Ser. No. 11/548, 207 filed Oct. 10, 2006 by the present inventor, which are hereby incorporated herein by reference as if set forth in full herein.

In addition to the above methods for forming one layer comprising at least silicon forming a desired pattern on a substrate, we may grow a layer of silicon (i.e., polysilicon) on a substrate by using deposition or epitaxy and then micromachine the polysilicon layer to form a desired pattern. Surface micromachining is an established micromachining process that may produce up to five layers of polysilicon structures currently. Polysilicon surface micromachining is one section (pp. 69-71) of the book titled as "An Introduction to Microelectromechanical Systems Engineering" written by N. Maluf and K. Williams and published by Artech House, Inc. (Norwood, Mass.) in 2004. This book section is hereby incorporated herein by reference as if set forth in full herein. Those skilled in the art understand that an up to five-layer polysilicon structure may be formed on the substrate with surface micromachining.

Block 284 of FIG. 10 calls for attaching the formed at least one layer onto the desired surface and area of the first substrate.

Block 286 of FIG. 10 calls for separating the second substrate from the formed at least one layer. We may dissolve either the second substrate or a releasing layer on the second substrate if it exists to release the formed at least one layer. We may also use mechanical means such as grinding, lapping, diamond machining, or CMP to remove the substrate to release the formed at least one layer.

Block 288 of FIG. 10 calls for perform a desired removing operation if the formed at least one layer comprises at least one sacrificial material and it is desired to remove at least a portion of at least one sacrificial material.

In order that those skilled in the art will be better able to practice the present invention, the following examples are given by way of illustration and not by way of limitation.

FIGS. 11A-11C shows a first example, which schematically depict side views at various stages of a process for forming a patterned silicon layer on a substrate according to Block 282 of the fourth embodiment.

FIG. 11A shows an SOI wafer that have a top silicon layer 290 and a bottom silicon layer 292. A $SiO_2$ layer 294 is between the silicon layers 290 and 292.

FIG. 11B shows that a layer of etch mask 296 (e.g., a photoresist) is patterned on the top silicon layer 290.

A proper etching process such as DRIE is used to etch exposed silicon through the thickness of the silicon layer 290 from the top surface of the silicon layer 290. FIG. 11C shows the etching result where the etch mask 296 has been removed. A pattered silicon layer 298 is formed.

If needed, we may fill in one or more other materials into the patterned silicon layer 298. Also if needed, we may planarized the top surface of the layer 298 to reach a suitable thickness, flatness, and smoothness.

FIGS. 12A-12E shows a second example, which schematically depict side views at various stages of a process for forming a patterned polysilicon layer on a substrate according to Block 282 of the fourth embodiment.

FIG. 12A shows a provided substrate 302 such as a silicon wafer.

FIG. 12B shows a layer of $SiO_2$ 304 that may be deposited on the substrate 302 using LPCVD (Low Pressure Chemical Vapor Deposition) or PECVD (Plasma-Enhanced Chemical Vapor Deposition). If needed, a planarization process may be used to reach a suitable flatness and smoothness.

FIG. 12C shows a layer of polysilicon 306 is formed on the $SiO_2$ layer 304. Polysilicon may be formed by LPCVD or epitaxy. If needed, a planarization process may be used to reach a suitable thickness, flatness, and smoothness.

FIG. 12D shows that a layer of etch mask 308 (e.g., a photoresist) is patterned on the top polysilicon layer 306.

A proper etching process such as wet etching or DRIE may be used to etch exposed polysilicon through the thickness of the layer 306 from the top surface of the layer 306. FIG. 12E shows the etching result where the etch mask 308 has been removed. A pattered polysilicon layer 310 is formed.

If needed, we may fill in one or more other materials into the patterned polysilicon layer 310. Also if needed, we may planarized the top surface of the layer 310 to reach a suitable thickness, flatness, and smoothness.

A third example is shown in FIGS. 13A-13F which schematically depict side views at various stages of a process for forming a one-layer silicon structure on a substrate according to the fourth embodiment of the invention.

Figure 13A:
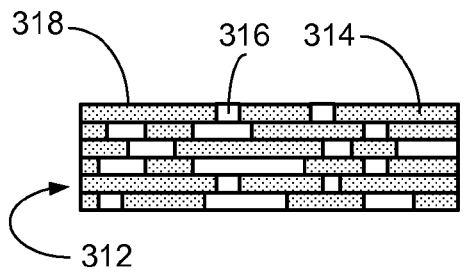
FIGS. 13A-13F show a third example, which schematically depict side views at various stages of a process for forming a one-layer silicon structure on a substrate according to the fourth embodiment of the invention.

FIG. 13A shows a six-layer silicon structure 312. Each layer comprises silicon 314 and sacrificial material 316. This silicon structure 312 may be made with the process shown in the first example of the first embodiment of the present invention and can be viewed as a substrate in the current example of the present patent.

Figure 13B:
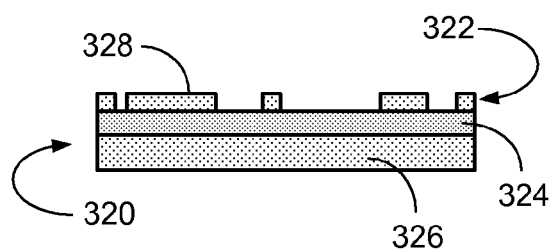

FIG. 13B shows a structure 320 that comprises a one-layer silicon structure 322 on a releasing $SiO_2$ layer 324 that is on a silicon wafer substrate 326. The structure 320 may be made with either of the processes described in the first and second examples of the fourth embodiment.

Figure 13C:
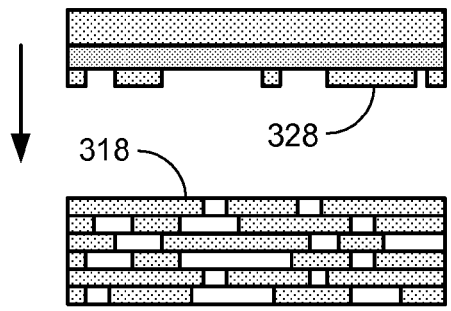

FIG. 13C shows that the structure 320 is oriented so that surface 328 is to be bonded to the surface 318 of the substrate 312. Note that the both surfaces 318 and 328 have been machined to have suitable flatness and smoothness for the following silicon bonding operation.

Figure 13D:
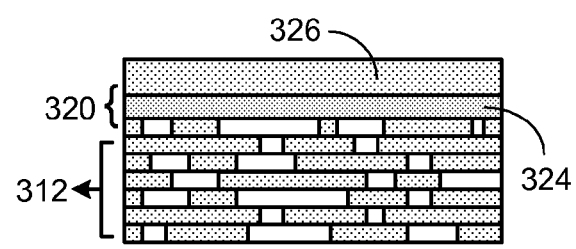
Figure 13E:
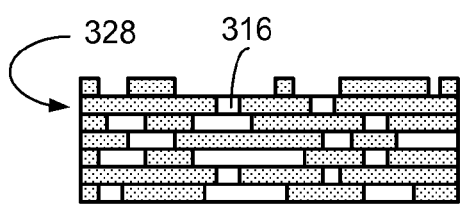
Figure 13F:
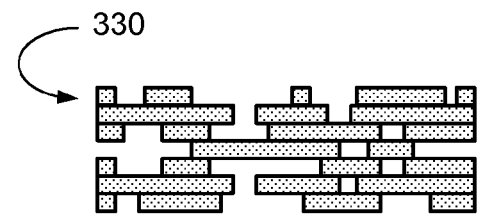

FIG. 13D shows that the structure 320 has been bonded to the structure 312 by using a suitable silicon direct bonding technique.

The $SiO_2$ layer 324 in FIG. 13D is then etched to separate the silicon wafer substrate 326. We may use a $SiO_2$ etchant such as hydrofluoric acid or the like to etch the $SiO_2$ layer 324. A structure 328 is formed shown in FIG. 13E.

As the structure 328 comprises the sacrificial material 316, if needed, we may remove it with a desired removing operation such as chemical dissolution. In this example, the sacrificial material 316 is removed and a final seven-layer structure 330 is formed shown in FIG. 13F.

Figure 14:
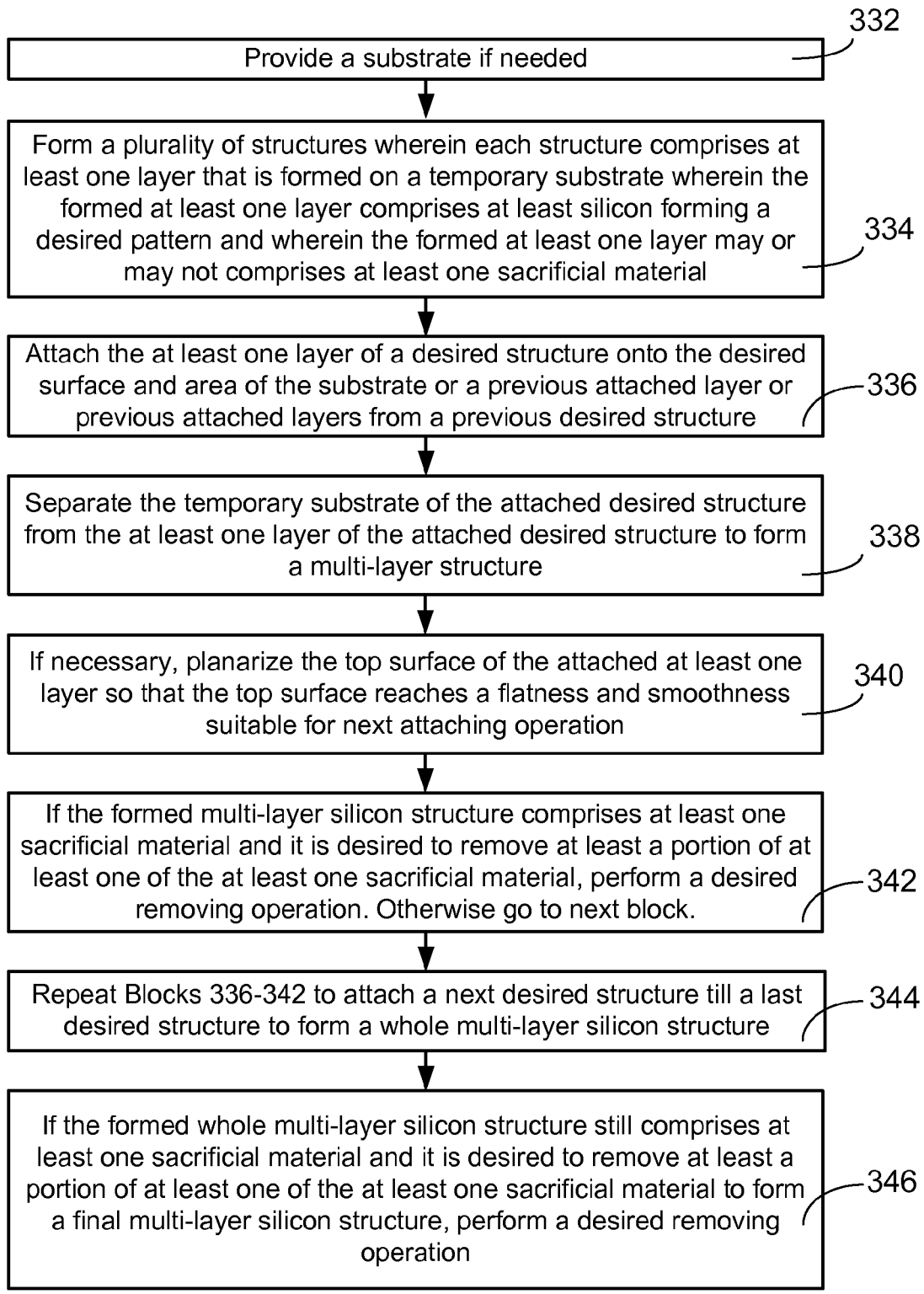
FIG. 14 provides a block diagram of a process of a fifth generalized embodiment of the present invention which is an extension of the fourth generalized embodiment for forming multi-layer silicon structures.

FIG. 14 provides a block diagram of a process of a fifth generalized embodiment of the present invention which is an extension of the fourth generalized embodiment for forming multi-layer silicon structures.

Block 332 of FIG. 14 calls for providing a substrate if needed.

Block 334 of FIG. 14 calls for forming a plurality of structures wherein each structure comprises at least one layer that is formed on a temporary substrate wherein the formed at least one layer comprises at least silicon forming a desired pattern and wherein the formed at least one layer may or may not comprises at least one sacrificial material.

Block 336 of FIG. 14 calls for attaching the at least one layer of a desired structure onto the desired surface and area of the substrate or a previous attached layer or previous attached layers from a previous desired structure. In the case that a substrate is not needed, we then attach two desired structures together as a first step. In such a case, technically either one of the two structures may be viewed as a substrate.

Block 338 of FIG. 14 calls for separating the temporary substrate of the attached desired structure from the at least one layer of the attached desired structure to form a multi-layer structure.

Block 340 of FIG. 14 calls for, if necessary, planarizing the top surface of the attached at least one layer so that the top surface reaches a flatness and smoothness suitable for next attaching operation.

Block 342 of FIG. 14 calls for performing a desired removing operation if the formed multi-layer silicon structure comprises at least one sacrificial material and it is desired to remove at least a portion of at least one of the at least one sacrificial material. Otherwise go to next block 344.

Block 344 of FIG. 14 calls for repeating Blocks 336-342 to attach a next desired structure till a last desired structure to form a whole multi-layer silicon structure.

Block 346 of FIG. 14 calls for performing a desired removing operation if the formed whole multi-layer silicon structure still comprises at least one sacrificial material and it is desired to remove at least a portion of at least one sacrificial material to form a final multi-layer silicon structure.

In order that those skilled in the art will be better able to practice the present invention, the following examples are given by way of illustration and not by way of limitation.

A first example is shown in FIGS. 15A-15G which schematically depict side views at various stages of a process for forming a two-layer silicon structure on a substrate according to the fifth embodiment of the invention.

Figure 15A:
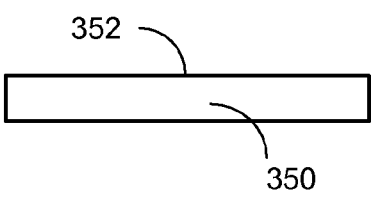
FIGS. 15A-15G show a first example, which schematically depict side views at various stages of a process for forming a two-layer silicon structure on a substrate according to the fifth embodiment of the invention.

FIG. 15A shows a silicon substrate 350. Surface 352 of the silicon substrate 350 is flat, smooth and clean, which is suitable for silicon direct bonding.

Figure 15B:
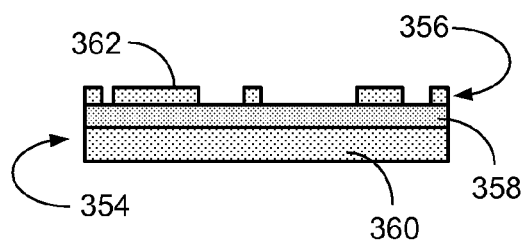

FIG. 15B shows a first structure 354 that comprises a one-layer silicon structure 356 on a releasing $SiO_2$ layer 358 that is on a silicon wafer substrate 360. The structure 354 may be made with either of the processes described in the first and second examples of the fourth embodiment. Surface 362 is flat, smooth and clean, which is suitable for silicon direct bonding.

Figure 15C:
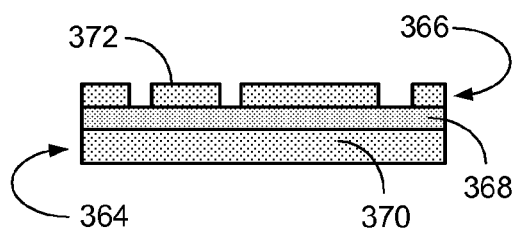

FIG. 15C shows a second structure 364 that also comprises a one-layer silicon structure 366 on a releasing $SiO_2$ layer 368 that is on a silicon wafer substrate 370. The structure 364 may be made with either of the processes described in the first and second examples of the fourth embodiment. Surface 372 is flat, smooth and clean, which is suitable for silicon direct bonding.

Figure 15D:
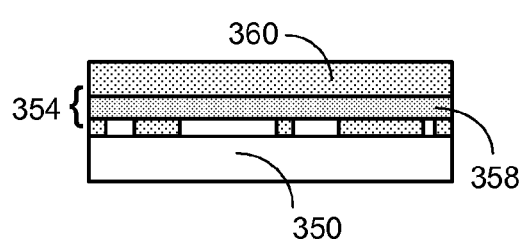
Figure 15E:
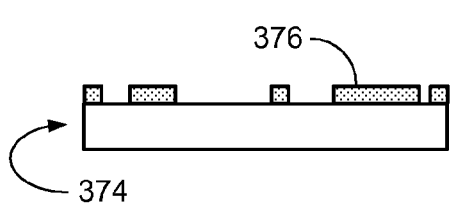

FIG. 15D shows that a first bonding operation has been finished so that the structure 354 and the substrate 350 have been bonded together by using a suitable silicon bonding technique. The surfaces 352 and 362 are the surfaces that are bonded together.

The $SiO_2$ layer 358 in FIG. 15D is then etched to separate the silicon wafer substrate 360. We may use a $SiO_2$ etchant such as hydrofluoric acid or the like to etch the $SiO_2$ layer 358. A structure 374 is formed shown in FIG. 15E. If needed, we may planarize top surface 376 of the structure 374 to be flat and smooth, which is therefore suitable for silicon direct bonding.

Figure 15F:
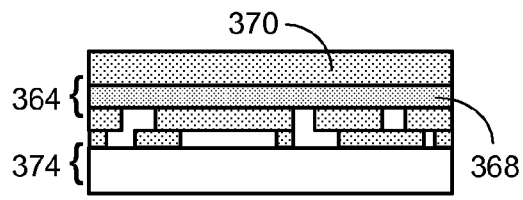
Figure 15G:
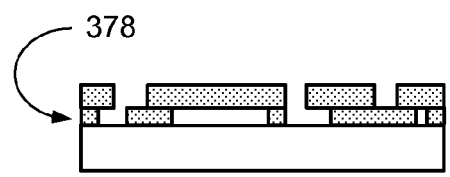

FIG. 15F shows that a second bonding operation has been finished so that the structure 364 and the structure 374 have been bonded together by using a suitable silicon bonding technique. The surfaces 372 and 376 are the surfaces that are bonded together.

The $SiO_2$ layer 368 in FIG. 15F is then etched to separate the silicon wafer substrate 370. We may use a $SiO_2$ etchant such as hydrofluoric acid or the like to etch the $SiO_2$ layer 368. A structure 378 is formed shown in FIG. 15G, which comprises two silicon layers.

A second example is shown in FIGS. 16A-16F which schematically depict side views at various stages of a process for forming a three-layer silicon structure according to the fifth embodiment of the invention.

FIG. 16A shows three formed structures 380, 390 and 400. These three structures have a similar structure.

The three structures 380, 390 and 400 respectively comprise a one-layer silicon structure 382, 392 and 402 on a releasing $SiO_2$ layer 384, 394 and 404 that are on a silicon wafer substrate 386, 396 and 406, respectively. The three one-layer silicon structure 382, 392 and 402 comprise a same sacrificial material 381. Top surfaces 388, 398 and 408 of the three structures are flat, smooth and clean, which are suitable for silicon direct bonding.

FIG. 16B shows that a first bonding operation has been finished so that the structure 380 and the structure 390 have been bonded together by using a suitable silicon bonding technique. The surfaces 388 and 398 are the surfaces that are bonded together.

The $SiO_2$ layers 384 and 394 in FIG. 16B are then etched to separate the silicon wafer substrates 386 and 396. We may use a $SiO_2$ etchant such as hydrofluoric acid or the like to etch the $SiO_2$ layers 384 and 394. A structure 410 is formed shown in FIG. 16C. If needed, we may planarize top surface 412 of the structure 410 to be flat and smooth, which is therefore suitable for silicon direct bonding.

FIG. 16D shows that a second bonding operation has been finished so that the structure 400 and the structure 410 have been bonded together by using a suitable silicon bonding technique. The surfaces 408 and 412 are the surfaces that are bonded together.

The $SiO_2$ layer 404 in FIG. 16D is then etched to separate the silicon wafer substrate 406. We may use a $SiO_2$ etchant such as hydrofluoric acid or the like to etch the $SiO_2$ layers 404. A structure 414 is formed shown in FIG. 16E.

As the structure 414 comprises three silicon structure layers which comprise silicon 416 and the sacrificial material 381, if needed, we may remove the sacrificial material 381 with a desired removing method such as chemical dissolution. In this example, the sacrificial material 381 is completely removed and a final three-layer silicon structure 418 is formed shown in FIG. 16F.

Though this specification has provided various embodiments and examples, it is intended that teachings in a specific embodiment or example are applied to other embodiments or examples to the extent that the features of the different embodiments or examples make such application functional and do not otherwise contradict or remove all benefits of the adopted embodiments or examples. Various other embodiments of the present invention exist. Some of these embodiments may be based on a combination of the teachings herein with various teachings incorporated herein by reference.

Though this specification has provided various embodiments and examples for making multi-layer silicon structures, various teachings and features in this specification may be applied to make multi-layer structures of other materials.

It should be noted that all the features disclosed as well as combinations of the features disclosed are the object of this invention. While the present invention has been described with reference to particular embodiments and examples thereof, it will be understood that many further embodiments, alternatives, modifications and implementations will be apparent by those skilled in the art without actually departing from the spirit and scope of the invention as defined in the above description. As such, it is not intended that the invention be limited to the particular illustrative embodiments and examples described above but instead that it be solely limited by the claims presented hereafter.

What is claimed is:

1. A method for forming a multi-layer silicon structure, comprising:
   (a) forming a plurality of individual layers,
      wherein each of the plurality of individual layers comprises at least silicon wherein the at least silicon forms a pattern;
      wherein at least one of the plurality of individual layers comprises a plurality of discrete silicon features wherein the discrete silicon features are held together with at least one sacrificial material and wherein at least a portion of the discrete silicon features is exposed on at least one surface of the at least one layer; and
      wherein a thickness of at least one of the plurality of individual layers is greater than a predetermined value;
   (b) aligning the plurality of individual layers;
   (c) attaching at least the plurality of individual layers together,
      wherein at least a portion of the exposed portion of the discrete silicon features of the at least one layer comprising the discrete silicon features is attached to a receiver and wherein after the at least one layer that is thicker than the predetermined value is attached to a receiver, the thickness is reduced to the predetermined value; and
   (d) removing the at least one sacrificial material to release the discrete silicon features from the at least one sacrificial material after the step of (c).

2. The method of claim 1 wherein the removing operation comprises using chemical etching or electrochemical etching.

3. The method of claim 1 wherein the at least one sacrificial material comprises at least one polymer and wherein the removing operation comprises using burning or pyrolyzing.

4. The method of claim 3 wherein the at least one polymer comprises epoxy or polymethylmethacrylate.

5. The method of claim 1 wherein the attaching operation in the step (c) comprises at least using silicon bonding.

6. The method of claim 5 wherein the silicon bonding is silicon direct bonding or plasma activation silicon direct bonding.

7. The method of claim 1 wherein the thickness reducing operation in the step (c) comprises using mechanical planarization and/or chemical mechanical planarization.

8. The method of claim 1 wherein the formation of at least one of the at least one layer comprising a plurality of discrete silicon features in the step (a), comprises:
   (i) providing a layer of silicon;
   (ii) forming at least one blind opening in the layer;
   (iii) filling at least one sacrificial material into at least one of the at least one blind opening; and
   (iv) thinning the layer,
      wherein after the thinning operation, a plurality of discrete silicon features are formed wherein the discrete silicon features are held together with the at least one sacrificial material and wherein at least a portion of the discrete silicon features is exposed on at least one surface of the layer.

9. The method of claim 1,
   Wherein in the step (a) at least one of the at least one layer that is thicker than the predetermined value comprises at least one blind opening wherein the at least one blind opening is formed through a same surface;
   wherein in the step (c) the surface of the at least one layer comprising the at least one blind opening, through which the at least one blind opening is formed, is attached to a receiver; and
   wherein in the step (c) after the thickness of the at least one layer comprising the at least one blind opening is reduced to the predetermined value, a plurality of discrete silicon features are formed.

10. The method of claim 9 wherein at least one of the at least one blind opening is filled with at least one sacrificial material.

11. The method of claim 10 further wherein the at least one sacrificial material is removed after the step (c) of claim 1.

12. A method for forming a multi-layer silicon structure, comprising:
   (a) forming a plurality of individual layers, wherein each layer comprises at least silicon wherein the at least silicon forms a pattern;
      wherein each layer comprises at least one blind opening wherein the at least one blind opening is formed through a same surface; and
      wherein at least one of the at least one blind opening of at least one of the plurality of individual layers is filled with at least one sacrificial material;
   (b) aligning the plurality of individual layers;
   (c) attaching at least the plurality of individual layers together,
      wherein the surface of each layer, through which the at least one blind opening is formed, is attached to a receiver; and
      wherein after each layer is attached to a receiver, the layer is thinned to expose at least one of the at least one blind opening, wherein after the thinning operation, a plurality of discrete silicon features are formed at least in one of the thinned layers; and (d) removing the at least one sacrificial material to release the discrete silicon features from the at least one sacrificial material after the step (c).

13. The method of claim 12 wherein the formation of at least one of the plurality of individual layers in the step (a), comprises:

(i) providing a layer of silicon; and
(ii) forming at least one blind opening through a same surface of the layer.

14. The method of claim 12 wherein the thinning operation comprises using mechanical planarization and/or chemical mechanical planarization.

* * * * *